United States Patent [19]

Movchan et al.

[11] Patent Number: 4,922,995
[45] Date of Patent: May 8, 1990

[54] METHOD OF PRODUCING MONOLITHIC METAL BLANKS BY FREEZING-ON TECHNIQUES

[75] Inventors: Boris A. Movchan; Vladimir A. Panna; Evgeny V. Chernenko; Naum A. Gorba, all of Kiev, U.S.S.R.

[73] Assignee: Institut Elektrosvarki Imeni E.O. Patona an USSR, Kiev, U.S.S.R.

[21] Appl. No.: 268,742

[22] Filed: Nov. 8, 1988

[30] Foreign Application Priority Data

Apr. 8, 1987 [SU] U.S.S.R. ............... 4293750

[51] Int. Cl.$^5$ ............... B22D 23/00; B22D 27/02
[52] U.S. Cl. ............... 164/469; 164/122; 164/483; 164/494
[58] Field of Search ............... 164/122, 122.1, 122.2, 164/47, 459, 466, 469, 483, 492, 493, 494, 454, 455

[56] References Cited

U.S. PATENT DOCUMENTS

| 3,620,686 | 11/1971 | Pfann ............... 164/122.1 |
| 4,177,058 | 12/1979 | Paton et al. ............... 164/492 |
| 4,552,200 | 11/1985 | Sinha et al. ............... 164/454 |
| 4,583,580 | 4/1986 | Hunt ............... 164/469 |

OTHER PUBLICATIONS

"Casting by Freezing-On Techniques", by G. F. Balandin, 1962, Mashgiz, Moscow, pp.7–16 and 251 (no translation).

Primary Examiner—Richard K. Seidel
Attorney, Agent, or Firm—Fleit, Jacobson, Cohn, Price, Holman & Stern

[57] ABSTRACT

A method of producing monolithic metal blanks by freezing-on techniques resides in that the surface of a liquid metal melt is heated with the formation of a variable temperature field, defined by the temperature gradient between heating zones and cooling zones. The lines of equal temperatures constitute isotherms. The heating zones are disposed so that the isotherms having a temperature close to the crystallization temperature $T_c$ repeat the shape of the cross-section of the blank to be produced. A dummy bar is immersed equidistantly to the isotherm with the temperature of crystallization $T_c$. Subsequent drawing out of the dummy bar from the melt with a linear speed defined by the rate of crystallization results in the formation of the blank.

9 Claims, 4 Drawing Sheets

METHOD OF PRODUCING MONOLITHIC METAL BLANKS BY FREEZING-ON TECHNIQUES

FIELD OF THE ART

The present invention relates to vacuum metallurgy and, more particularly, to a method of producing monolithic metal blanks by freezing-on techniques.

INDUSTRIAL APPLICABILITY

The invention may find application in instrument-making, power engineering, and other industries for producing monolithic blanks and articles of a prescribed shape and with a prescribed structure from non-deformable alloys, for instance, for producing permanent magnets, blanks from high alloys.

PRIOR ART

Growing requirements for the purity of alloys, an increase in the degree of alloying, the necessity of ensuring a programmed structure call for the elaboration of corresponding technological processes of producing metal blanks.

Among other methods of providing a required structure and a required form of the blank, freezing-on techniques are advantageous in that progressive freezing occurs in comparatively thin layers of metal, the process taking place under the conditions of an abundant feeding of the crystallization front.

The prior-art methods of casting by freezing-on techniques are used for producing blanks of different kinds: sheets, rods, shaped articles (G. F. Balandin, "Casting by Freezing-on Techniques", 1962, Mashgiz, Moscow, pp. 7-16 /in Russian/).

Hollow bulk articles are produced by slush casting, according to which liquid metal is poured into a mould secured on a rotary casting device. After a period of time required for a crust of a preset thickness to be frozen-on (to solidify or crystallize) on the surface of the mould, the mould is turned over and liquid metal is poured out of the mould. The casting thus produced has the form of a crust solidified on the surface of the mould.

Castings are formed in a similar manner when hollow articles are produced by vacuum suction casting. In this case liquid metal from a ladle or a furnace is sucked into a mould, kept there for a preset time, then the vacuum is disturbed, and the non-solidified metal is drained into the furnace or ladle. A hollow casting in the form of a thin-walled shell is left on the surface of the mould.

Known in the art is a method of freezing-on onto a rotating rod (dip casting), which gives castings in the form of cylindrical shells with internal finning and a smooth external surface. With this method a cooled rod is immersed into liquid metal and simultaneously rotated therein. A crust of metal with a smooth and clean surface is frozen on the surface of the rod.

Thick-walled large-size panel-type castings are produced by press-out casting. With this process the melt poured into a receptable of a casting machine is pressed out upwards by turning a movable half-mould. While flowing between the half-moulds, the melt cools down and a crust is frozen on the surface of the half-moulds. By the end of the casting process excess metal is pressed out and the crusts can come together, thus forming a body of the casting.

Freezing-on processes are characteristic of some methods of continuous casting. Such is a method of casting a metal ribbon, residing in that a water-cooled roll is immersed with a part of its external surface into a bath with liquid metal. A crust is frozen on the surface of the roll and it is continuously drawn out of the bath as the roll rotates. The crust may also be drawn by means of two rotating rolls between which metal is poured. Crusts of metal, frozen on the surface of the rolls come close together in the place of contact of said rolls and merge. The non-solidified metal is pressed out.

A method closest to the method of the present invention in its technical essence is that of producing monolithic blanks by freezing-on techniques (G. F. Balandin, "Casting by Freezing-on Techniques", 1962, Mashgiz, Moscow, p. 251 /in Russian/).

The essence of the method is as follows. A plate made of a refractory material and provided with an opening whose shape corresponds to the profile of the article to be produced is placed on the surface of a melt in the crucible of a melting furnace. When pressure is exerted on the plate, the melt is pressed out of the opening as a column with a convex meniscus. Into this portion of the melt a dummy bar is lowered, the cross-section of the dummy bar being in strict correspondence with the profile of the article to be produced (an ingot, a tube, or a ribbon). As the dummy bar is drawn out of the opening in the floating plate, a part of the melt is drawn out together with the dummy bar as a result of the action of surface forces. At the same time freezing-on of the melt commences on the end face of the dummy bar and goes on continuously. The method is very sensitive to changes in the thermal conditions under which the casting is formed.

However, with this method, as well as with other methods of casting by freezing-on techniques, one cannot actively control the thermal processes during crystallization (solidification) and, hence, the structure of the resulting alloy.

The presence of shaping surfaces may lead to contamination of the metal with the material of the mould and to the origination of surface defects in the casting.

Quality metal cannot be obtained with the use of the layer-by-layer freezing-on procedure because of an intensive oxidation of each layer.

Furthermore, the prior-art methods fail to provide a controllable structure of metal within one blank.

OBJECT AND BRIEF DESCRIPTION OF THE ESSENCE OF THE INVENTION

It is an object of the present invention to provide a method of producing monolithic metal blanks of a preset form and a required structure by freezing-on techniques.

Another object of the invention is to provide an enhanced purity of alloys having a high degree of alloying in the blanks produced.

This is achieved due to the fact that the method of producing monolithic metal blanks by freezing-on techniques resides in that a dummy bar is immersed into a liquid melt of metal and a blank is formed while the dummy bar and the melt are moving reciprocally and, according to the invention, at the stage of forming a blank the surface of the liquid melt of metal is heated with the formation of a variable temperature field, in which isotherms having a temperature close to that of the melt solidification, correspond to the contour of the resulting blank, contacting of the dummy bar with the liquid melt of metal being effected in a zone where the isotherms are equidistant to the contour of the blank cross-section.

It is reasonable that heating of the surface of the liquid melt of metal be effected with the aid of electron beams in a vacuum.

The creation of a variable temperature field in the liquid melt of metal makes it possible to form monolithic blanks of a variable cross-section from complex-alloyed alloys in the absence of shaping surfaces. Carrying out of the process in a vacuum and the use of an electron beam as a source of heat contribute to additional refining of the alloy and to attaining a high accuracy of the process.

It is expedient that the variable temperature field should be formed by changing the position of the zones of electron beam heating, or by changing the intensity of heating, or, else, by changing the intensity of cooling of the liquid bath.

It is desirable that the variable temperature field should be formed by simultaneous changing of the position of the heating zones, of the intensity of heating, and of the intensity of cooling of the liquid melt of metal.

The formation of the variable temperature field by the above-cited methods makes it possible to vary the temperature field of the liquid metal bath with a sufficient accuracy and speed, to obtain the required complexity of the temperature field configuration and the necessary temperature gradient.

The formation of a blank can be carried out by varying the heat removal through the dummy bar and the formed portion of the blank. Such a variation of the heat removal affects the heat balance in the zone of crystallization and, consequently, the size of the crystallizing phases.

If the alloy features definite thermophysical properties, the formation of a blank should be effected by periodic contacting of the dummy bar surface with the liquid melt of metal.

This allows one to intensify the heat removal from the crystallization surface of the blank being formed, to increase the temperature difference between the solid and liquid phase, and, consequently, to increase the dispersity of the structure.

It is efficient that in the course of forming a blank the frozen-on layer should be subjected to plastic deformation beyond the zone of contact of the dummy bar with the liquid melt of metal.

An additional intermediate deformation of the frozen-on layer makes it possible to increase the density of metal, to make its structure finer, and to intensify the heat removal from the surface of crystallization

BRIEF DESCRIPTION OF DRAWINGS

The invention is further exemplified by its embodiments given by way of illustration, with reference to the accompanying drawings, in which.

DETAILED DESCRIPTION OF THE INVENTION

Figure 1:
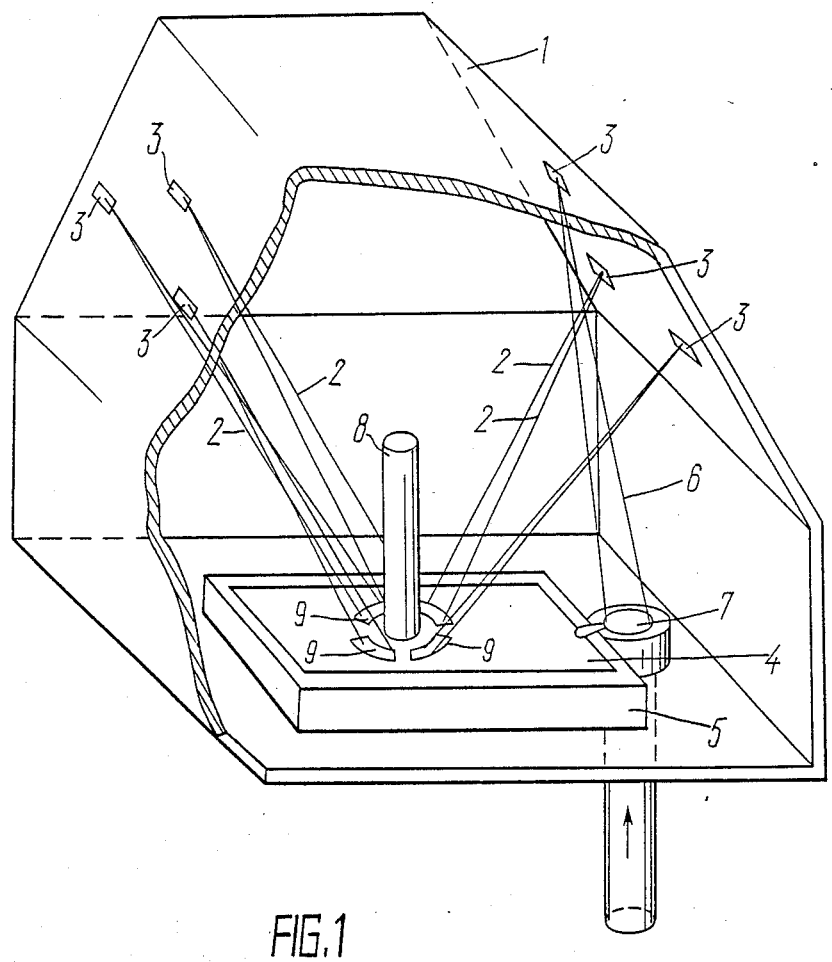
FIG. 1 is a diagram illustrating the method of forming a monolithic blank, according to the invention.

A method of producing monolithic metal blanks by freezing-on techniques is carried out on a vacuum plant (FIG. 1), comprising a vacuum chamber 1 wherein a vacuum is maintained, sufficient for creating an electron beam 2. Inclined walls of the chamber 1 are provided with openings 3 through which the electron beams 2 from electron guns (not shown in the drawing) are directed to the surface of a liquid melt of metal 4. The liquid melt of metal 4 is created in a cooled crucible 5. A constant level of metal in the cooled crucible 5 is maintained by melting an ingot 7 fed from below with an electron beam 6. A dummy bar 8 may be set in motion in relation to the surface of the liquid metal bath 4 with the aid of a drive (not shown in the drawing).

Figure 2:
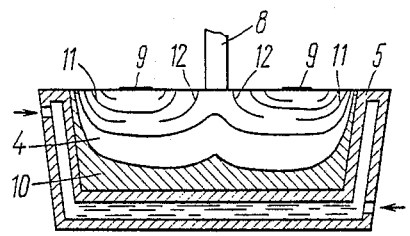
FIG. 2 shows a vertical section of the temperature field of a liquid melt of metal.

Let us now consider the method of producing monolithic metal blanks. The electron beams 2 are directed through the openings 3 to the surface of the liquid melt of metal 4 and heating zones 9 which give off heat for heating the liquid melt of metal 4 are formed on the surface of the liquid melt of metal 4. Directly in the vicinity of the cooled crucible 5 the metal is in a solid phase 10 (FIG. 2).

The resulting temperature field of the liquid melt of metal 4 is defined by the temperature gradient between the heating zones 9 and cooling zones.

The lines of equal temperatures make up isotherms 11.

Figure 4:
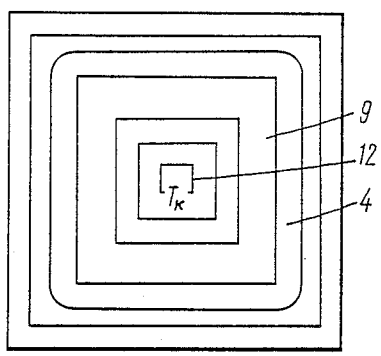
FIG. 4 shows a temperature field shaped as a square.
Figure 3:
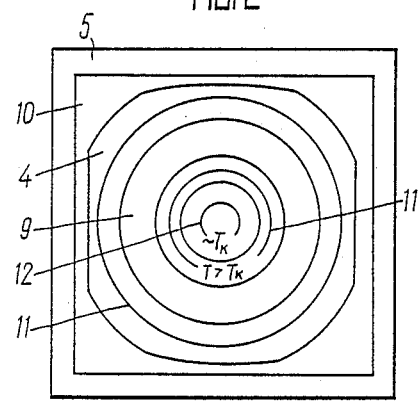
FIG. 3 shows a temperature field shaped as a ring.

The heating zones are arranged so that isotherms 12 having a temperature close to that of crystallization ($T_c$) should repeat the form of the cross-section of the blank to be produced. For instance, if on the surface of the liquid melt of metal 4 (FIG. 3) the heating zone 9 is shaped as a ring, the isotherm 12 with the temperature $T_c$ on the surface defines a ring. The dummy bar 8 is arranged equidistant to the isotherm 12 with the crystallization temperature $T_c$ (FIG. 2). Due to the heat removal through the dummy bar 8, crystallization commences on the surface thereof. The geometrical dimensions of the crystallization front are defined by the position of the isotherm having a temperature equal to that of crystallization. Formation of a blank is effected by subsequent drawing of the dummy bar 8 from the liquid melt of metal 4 with a linear speed depending on the rate of crystallization. The section of the blank is determined by the contour of the isotherm 12 with the temperature $T_c$, dependent on the contour of the temperature field. A variable temperature field will form a section, variable, e.g. along the length. Shifting the heating zone 9 over the surface of the liquid melt of metal 4 (FIG. 4), it is possible to change the position of the heating zones 9 in such a manner that the configuration of the temperature field will change and the contour of the isotherm 12 with the temperature $T_c$ will acquire the required configuration. For example, by making the electron beam 2 travel over the heating zone 9 defined by two concentrically disposed squares of different dimensions, we shall obtain in the middle of the smaller square an isotherm 12 with the temperature $T_c$ in the form of a square.

An increase in the intensity of the electron-beam heating, i.e. an increase in the power conveyed to the heating zone 9 (FIG. 3) brings about stronger overheating of the liquid melt of metal 4 in places adjacent to the heating zone 9. The temperature field changes in such a manner that the distance between the heating zone 9 and the isotherm 12 with the temperature $T_c$ increases, the isotherm 12 with the temperature $T_c$ recedes from the heating zone 9. In such a case, for example, an increase in the intensity of heating in the annular heating zone 9 will lead to a diminution of the diameter of the isotherm 12 with the temperature $T_c$ and to a diminution of the diameter of the blank.

Figure 5:
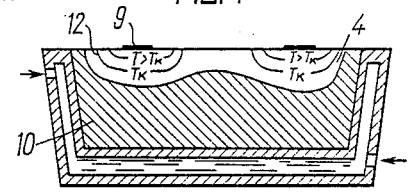
FIG. 5 shows a vertical section of the temperature field of a liquid melt of metal at an elevated intensity of crucible cooling.

If the intensity of heat removal, for instance, through the cooled crucible 5 (FIG. 2) from the liquid melt of metal 4 is increased by increasing the amount of the coolant or by lowering the temperature thereof, the temperature field will change in such a manner that the thickness of the solid phase 10 will increase (FIG. 5), the temperature gradient in the liquid melt of metal 4 will grow, the volume of the liquid melt of metal 4 will be reduced, and this will bring about a shift of the isotherm 12 with the temperature $T_c$ towards the heating zone 9.

A simultaneous change of the disposition of the heating zones 9, of the intensity of heating, and of the intensity of heat removal may ensure any complicated prescribed shape of the temperature field and, as a consequence, the cross-section of the blank of any required configuration.

By changing the intensity of heat removal through the dummy bar 8 (FIG. 1) and the formed portion of the blank, one controls the formation of the structure of the alloy being frozen-on. For example: the heat removal through the dummy bar 8 and the formed portion of the blank is diminished by an additional electron-beam heating thereof. Thereby the temperature of the solid phase 10 in the place of crystallization is increased, the temperature difference 'solid phase 10—liquid phase' is diminished, and, as a result, the crystallization rate is reduced and the size of the crystallizing phases is increased.

Under the conditions of an insufficiently intensive heat removal from the front of crystallization the formation of a blank is effected by periodic contacting of the crystallization surface of the blank with the liquid molten metal. At the moment when there is no contact between the surface of crystallization of the dummy bar 8 and the liquid melt of metal 4 an additional heat removal from the crystallization surface of the dummy bar 8 occurs. In subsequent contact of the crystallization surface of the dummy bar 8 with the liquid melt of metal 4 this allows crystallization of the alloy to be effected at a greater temperature difference between the solid and liquid phase. This increases the rate of crystallization and the dispersity of the phases.

During the formation of a blank, if required, plastic deformation of the frozen-on alloy is carried out beyond the zone of contact of the dummy bar 8 with the liquid melt of metal 4. To this end, after the dummy bar 8 is brought out of contact with the liquid melt of metal 4, the crystallized metal is subjected to deformation by any known method.

For instance, freezing-on of the alloy on the external cylindrical surface of a dummy bar 13 (FIG. 6) is carried out in such a manner that the cylinder (dummy bar 13) rotating about its axis contacts with its generatrix the liquid melt of metal 4. On the external cylindrical surface of the dummy bar 13 metal is frozen-on, which beyond the zone of contact with the liquid melt of metal 4 is deformed with a roller 14. Such an interaction increases the density of the frozen-on metal, makes the crystallizing phases finer, and intensifies the heat removal from the crystallization surface of the blank.

Now some examples of realizing the method will be considered.

EXAMPLE 1

Figure 7:
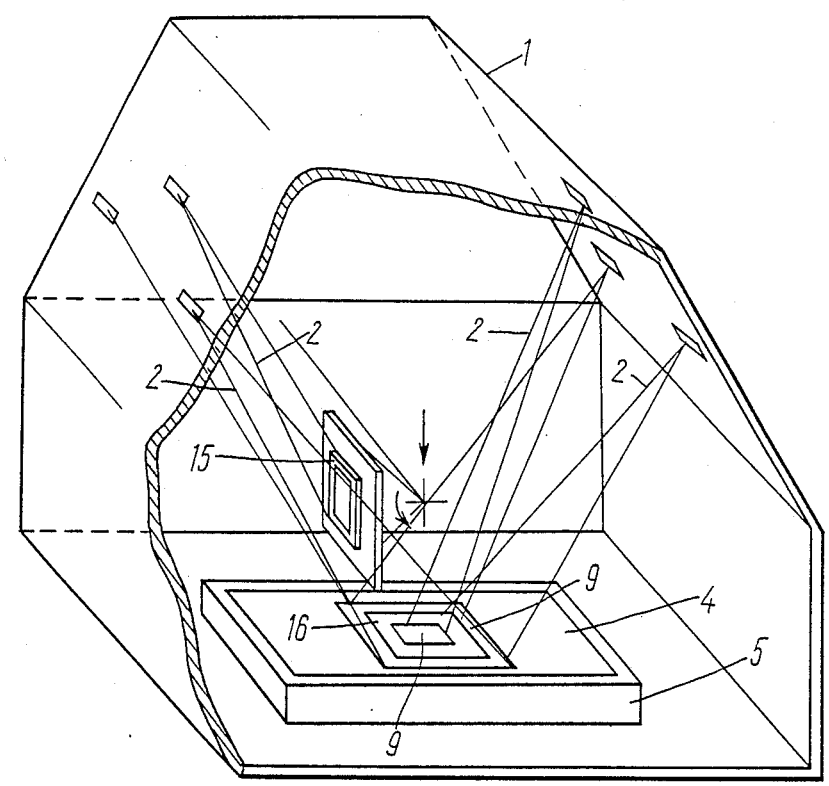
FIG. 7 illustrates the method of applying an alloy to the working edge of the die of a trimming press.

For producing a monolithic blank by freezing-on techniques, a working pressure of $1.10^{-2}$ to $6.5 \cdot 10^{-3}$ Pa was set up in a chamber 1 (FIG. 7). As the dummy bar use was made of the die of a trimming press 15, whose working edge is a projection 10 mm in height and 10 mm in thickness over the contour of a square opening of $60 \times 40$ mm in the plate of the die 15.

The die 15 serving as the dummy bar was manufactured from conventional tool steel. Frozen on the working edge of the die 15 was an alloy of the following composition, in mass %: C, 0.83; Cr, 4.0; W, 5.7; V, 1.9; Mo, 5.3; Si, 0.3; Mn, 0.25; Fe, the balance. The alloy was placed into a cooled crucible 5 of $200 \times 300 \times 40$ mm in size. The die 15 was preliminarily annealed and then secured to a movable shaft (not shown in the drawing). The alloy was melted in the crucible 5 and the working edge of the die 15 was heated with the aid of electron beams 2. As the temperature of the die reaches 1100°–1150° C., the die was ready to function as the dummy bar in the freezing-on procedure. By that moment a liquid melt of metal 4 was formed and a heating zone 9 was shaped. The internal heating zone 9, shaped as a square whose side is 30–35 mm smaller than the inner size of the working edge of the die 15, was formed by means of a uniformly scanned beam having a power of 30–35 kVA. An external zone shaped as a band, 40 mm wide, over the contour of a square with a side 30 mm greater than the external diameter of the working edge of the die 15, was formed with the aid of the electron gun beams having a total power of 100 kVA. Between the heating zones 9 a zone 16 is formed, in which the liquid melt of metal 4 has a temperature field with isotherms whose temperature is 20°–25° C. higher than the temperature of alloy crystallization. After heating the die 15 is turned to a position parallel to the surface of the liquid melt of metal 4, and the electron-beams 2 are switched off. The die 15 is immersed into the melt 4 to 2-3 mm into the zone where the contours of the isotherms are equidistant to the contour of the working edge. The freezing-on process lasts for 5–6 s. After that the die 15 is withdrawn from the liquid melt of metal 4.

The working surface of such die 15 after appropriate heat treatment has a hardness HRC 63-67, the resistance of the die 15 is increased by the factor of 4.

EXAMPLE 2

For producing a blank of an intricate shape and with a preset crystalline structure from a complex-alloyed non-deformable alloy, a working pressure of $1.10^{-2}$ to $6.5 \cdot 10^{-3}$ Pa was set up in the chamber 1. It was necessary to produce a blank, whose shape represented successively mated profiles of a $40 \times 40$ mm square, of a circle with a diameter d of 56 mm, of a circle with a diameter d of 40 mm, of a circle with a diameter d of 45 mm, of a $30 \times 30$ mm square, of a $20 \times 20$ mm square, of a circle with a diameter d of 70 mm, the length of each such element being 30 mm.

An alloy having the composition (in mass %): Ni, 18.2; Al 9.9; Co, 12.3; Cu, 6.5; Si, 0.14; Fe, the balance was placed in a water-cooled crucible of 300×400×70 mm in size.

To form a liquid melt of metal, the alloy was heated with the aid of electron-beams from four guns. Their overall power was 120 KVA. After the formation of the liquid melt of metal, a temperature field was formed with isotherms with the temperature of crystallization, shaped as a square. To this end, the beams were scanned over a band of 35–40 mm in width, disposed over the perimeter of a square whose side was 80 mm. Then a temperature field with isotherms 12 (FIG. 4), shaped as a square, was formed inside said square, the 40×40 mm square being formed by the isotherms 12 having a temperature close to the temperature of the initiation of crystallization.

A dummy bar made as a square 40×40×100 mm rod from conventional structure steel was arranged so that its longitudinal axis should be perpendicular to the surface of the liquid melt of metal and the 40×40 mm section should be equidistant to the isotherms of the temperature field of the liquid melt of metal. The dummy bar was preheated with an electron beam having a power of 15 kVA, scanned over the surface of the dummy bar to the height of 40 mm from the lower end to the temperature of 1200° C.

After stabilizing the temperature field by keeping the liquid melt of metal under the effect of the electron beams for 15 minutes, formation of a blank was started. The dummy bar was lowered vertically down till the end face of the dummy bar touched the surface of the liquid melt of metal. After the end face of the dummy bar touched the liquid melt of metal, the dummy bar was moved upwards with the speed of 5–6 mm/min. With said method a blank was produced, whose cross-section was a 40×40 mm square and the crystals were oriented in the direction of travel of the dummy bar.

To produce a blank with a cross-section shaped as a circle with a diameter d of 56 mm, the shape of the temperature field was changed so that the isotherms of the temperature field constituted concentric circles. To this end, the electron beams were scanned over the surface of a ring with an external diameter of 180 mm and an internal diameter of 100 mm. The power of the electron beams remained unchanged. The resulting temperature field had an isotherm 12 (FIG. 3) with a temperature close to the crystallization temperature $T_c$, and shaped as a ring with a diameter d of 56 mm. After changing the shape of the temperature field, the drawing out of the dummy bar from the liquid melt of metal was suspended for 5 min. Then the drawing was continued with the speed of 5 mm/min. To diminish the diameter of the blank to d of 40 mm, all other conditions being equal, the power of the electron beams was increased from 30 kVA to 35 kVA. As a result, the isotherms 12 of the temperature field changed their position, having diminished the diameter. The isotherm 12 with a temperature close to the crystallization temperature $T_c$ has become the diameter d=40 mm. After changing the shape of the temperature field, the drawing out of the blank was suspended for 5 min. Further drawing out of the blank with the diameter d of 40 mm was performed with the speed of 5 mm/min. The above-described conditions of freezing-on stipulate a definite intensity of cooling the liquid melt of metal, characterized by the quantity of the cooling liquid passing through the crucible, namely, 20 l/min. An increase in the flow rate of the cooling liquid to 36 l/min leads to such a change of the temperature field of the melt that the diameter of the blank increases to d of 45 mm.

Further shaping of the profile as a 30×30 mm square was effected by changing the temperature field; the form of the temperature field was changed from the ring-shaped to the square one. The heating zone was created as a band, 80 mm wide, over the perimeter of a 80×80 mm square; the power of the electron beams was changed from 36 kVA to 28 kVA.

The intensity of cooling the liquid melt of metal was changed by diminishing the flow rate of the cooling liquid from 36 l/min to 20 l/min. The speed of drawing out the blank was 5 mm/min.

The described freezing-on conditions provide a structure with columnar crystals, the area of each such crystal being 3–5 mm$^2$.

A diminution of the heat removal by heating the blank to the hight of 30–40 mm from the place of contact with the surface of the liquid melt of metal by means of an electron beam having a power of 2 kVA, leads to a reduction of the crystallization rate and, accordingly, of the drawing-out speed, from 5 mm/min to 0.5 mm/min, to an increase in the size of crystals to the cross-sectional area of 15–40 mm$^2$ each, and to a reduction of the cross-section to 20×20 mm.

Upon reaching the cross-section of 20×20 mm and the length of 30 mm the contacting of the blank with the liquid melt of metal was discontinued.

For obtaining a blank with the diameter d of 70 mm in section a temperature field was created with the heating zone shaped as a ring with the internal diameter of 120 mm and the external diameter of 70 mm. The liquid melt of metal was heated by using electron beams with the overall power of 120 kVA. No additional heating of the blank was carried out. Other conditions corresponded to those of forming the preceding section. The blank was formed by periodically contacting the crystallization surface of the blank with the liquid melt of metal in the following mode 10 s of contacting −20 s of cooling over the melt. 10 cycles were required for forming a 30 mm-long blank. The resulting structure of the alloy was characterized by equiaxial crystals with cross-sectional area of 2–3 mm$^2$ and absence of shrinkage defects. The geometrical dimensions varied within 5–10% of the required ones.

EXAMPLE 3

Figure 6:
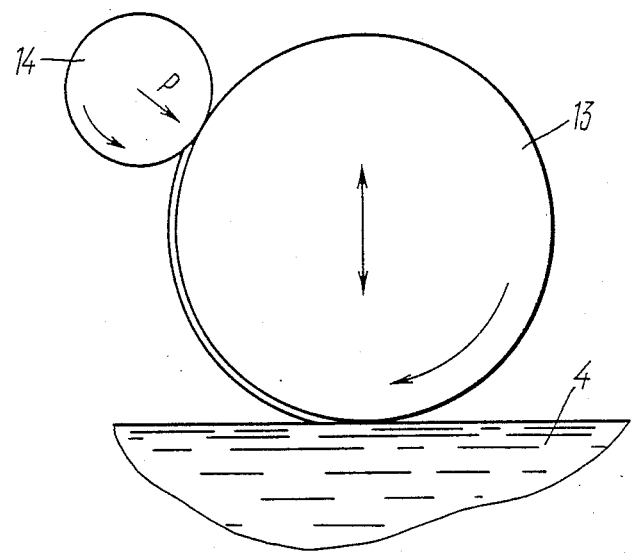
FIG. 6 is a diagram illustrating the method when the frozen-on layer is subjected to plastic deformation beyond the zone of contact of the dummy bar with the liquid melt of metal.

To form a blank for a disk cutter by freezing-on techniques, a dummy bar 13 was used, having a diameter d of 120 mm and a thickness δ=2 mm, from carbonaceous steel. A high alloy to be frozen-on had the following composition, mass %: Mo. 5.3; Si, 0.3; Mn, 0.25; Fe, the balance. A pressure of $1.10^{-2}$–$6.5 \cdot 10^{-3}$ Pa was set up in the chamber. The dummy bar 13 was secured on an axle parallel to the surface of liquid melt of metal 4 (FIG. 6). Rotating about the axle, the dummy bar could reciprocate up and down with respect to the surface of the molten metal bath. The speed of rotation of the dummy bar 3 about the axle was 15 rpm.

The liquid melt of metal 4 was obtained by following the same procedure as in Example 1.

The temperature field was formed so that isotherms with a temperature close to that of crystallization $T_c$ should make up a rectangle of 4×30 mm in size. To achieve this, the heating zone was formed by using electron beams with an overall power of 60 kVA, in the form of a band, 20 mm wide, running along the perimeter of a 100×50 mm rectangle. For a reliable fusion of the dummy bar 13 with the material being frozen-on, the dummy bar 13 was preheated to a temperature of 800°–850° C. The dummy bar 13 rotating about a horizontal axis was lowered so that the point of contact should coincide with the point of intersection of the diagonals of the isotherm rectangles. After the generatrix of the dummy bar 13 contacted the surface of the liquid melt of metal 4 and the dummy bar was immersed to the depth of 1–2 mm, drawing out (lifting of the rotating dummy bar 13) was effected with the speed of 0.5 mm/min. On the external surface of the dummy bar 13 a layer of the alloy was frozen, in the form of a ring, whose internal diameter was equal to the external diameter of the dummy bar and whose thickness δ was 4 mm.

After freezing-on the alloy to the diameter d=122 mm of the blank, the layer being frozen-on was subsequently subjected to plastic deformation beyond the zone of contact of the dummy bar with the molten metal 4. This was done with the aid of a roller 14 having a smooth external surface, acting with an effort of P=20 kN. As a result, a blank for a disk cutter was produced, having a diameter d of 130 mm, with the thickness of the working zone of 4 mm, without shrinkage defects, and with a minimal allowance for machining.

Thus, the herein-proposed method of producing monolithic blanks by freezing-on techniques features a sufficient simplicity and reliability. It allows monolithic blanks to be produced practically from any metallic materials. Controllable crystallization (solidification) conditions allow the shaping of monolithic blanks with any prescribed structure, of any form, with a sufficient accuracy of their geometrical dimensions.

What is claimed is:

1. A method of producing monolithic blanks by freezing-on techniques, comprising:
   (a) producing a bath of a liquid melt of metal;
   (b) heating the surface of said liquid melt of metal according to a preset program to produce a variable temperature field, the isotherms of which having a temperature close to the solidification temperature of the alloy and corresponding to the contour of said blank to be produced;
   (c) contacting a dummy bar with said liquid melt of metal and forming the blank so that the contour of said isotherm is similar to the contour of the area produced by the intersection of the dummy bar or blank and the surface of the liquid metal melt.

2. A method according to claim 1, wherein at stage (b) heating of the surface of said liquid melt of metal is effected with the use of electron beams in a vacuum.

3. A method according to claim 1, wherein at stage (b) said temperature field is formed by changing the position of heating zones.

4. A method according to claim 1, wherein at stage (b) said variable temperature field is formed by changing the intensity of heating.

5. A method according to claim 1, wherein at stage (b) said variable temperature field is formed by changing the intensity of cooling of said liquid melt of metal.

6. A method according to claim 1, wherein at stage (b) said variable temperature field is formed by simultaneously changing the position of heating zones, intensity of heating, and intensity of cooling said liquid melt of metal.

7. A method according to claim 6, wherein forming of said blank is carried out by changing the heat removal through said dummy bar and the formed portion of said blank.

8. A method according to claim 7, wherein at stage (b) forming of said blank is carried out by periodically contacting the crystallization surface of said dummy bar with said liquid melt of metal.

9. A method according to claim 8, wherein at stage (b) during the formation of said blank a frozen-on layer is subjected to plastic deformation beyond the zone of contact of said dummy bar with said liquid melt of metal.

* * * * *